United States Patent
Kalhan et al.

(10) Patent No.: US 11,165,531 B2
(45) Date of Patent: Nov. 2, 2021

(54) LAYERED MODULATION WITH MULTIPLE CODING RATES FOR MACHINE TYPE COMMUNICATION (MTC) TRANSMISSIONS

(71) Applicant: Kyocera Corporation, Kyoto (JP)

(72) Inventors: Amit Kalhan, San Diego, CA (US); Henry Chang, San Diego, CA (US)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 16/328,664

(22) PCT Filed: Sep. 11, 2017

(86) PCT No.: PCT/US2017/051009
§ 371 (c)(1),
(2) Date: Feb. 26, 2019

(87) PCT Pub. No.: WO2018/049349
PCT Pub. Date: Mar. 15, 2018

(65) Prior Publication Data
US 2019/0181975 A1 Jun. 13, 2019

Related U.S. Application Data

(60) Provisional application No. 62/398,664, filed on Sep. 23, 2016, provisional application No. 62/398,654, (Continued)

(51) Int. Cl.
*H04L 1/00* (2006.01)
*H04W 48/10* (2009.01)
(Continued)

(52) U.S. Cl.
CPC .......... *H04L 1/0003* (2013.01); *H03M 13/25* (2013.01); *H04L 1/0014* (2013.01);
(Continued)

(58) Field of Classification Search
CPC ............... H04L 1/0003; H04L 27/3488; H04L 12/1881; H04L 7/065; H04L 5/0035;
(Continued)

(56) References Cited

U.S. PATENT DOCUMENTS

2002/0183020 A1   12/2002   Zhu et al.
2006/0198454 A1*  9/2006    Chung ................ H04L 27/3488
                                                    375/260
(Continued)

FOREIGN PATENT DOCUMENTS

WO   2008-063108 A1   5/2008
WO   2016/136491 A1   9/2016

OTHER PUBLICATIONS

Kazunori Hayashi and Megumi Kaneko; "Cooperative Communications Via Superposition Coding," Preface, Fig 2, and Para 2 on p. SS-10; IEICE Communications Society; Sep. 8, 2015; pp. SS9-SS10.

(Continued)

*Primary Examiner* — Kwang B Yao
*Assistant Examiner* — Syed M Bokhari (57) ABSTRACT

The base station includes an encoder that encodes a first set of bits of MTC information with a first coding rate and encodes a second set of MTC information bits with a second coding rate. The first set and second set of bits are modulated using layered modulation and broadcast within the service area of the base station in a first transmission such that the first set of bits can be recovered using the low modulation order and the second set of bits can be recovered using the high modulation order. A relay station receives, demodulates and decodes the first transmission to recover at least the second set of bits. The relay station transmits a second set transmission including at least the second set of bits to at (Continued)

least one MTC device that did not recover the second set of bits from the first transmission.

7 Claims, 7 Drawing Sheets

Related U.S. Application Data filed on Sep. 23, 2016, provisional application No. 62/393,237, filed on Sep. 12, 2016.

(51) Int. Cl.
| | | |
|---|---|---|
| *H04L 12/18* | (2006.01) | |
| *H04L 27/34* | (2006.01) | |
| *H03M 13/25* | (2006.01) | |
| *H04L 5/00* | (2006.01) | |
| *H04L 7/06* | (2006.01) | |
| *H04W 4/70* | (2018.01) | |

(52) U.S. Cl.
CPC ......... *H04L 1/0077* (2013.01); *H04L 5/0035* (2013.01); *H04L 7/065* (2013.01); *H04L 12/1881* (2013.01); *H04L 27/3488* (2013.01); *H04W 48/10* (2013.01); *H04W 4/70* (2018.02)

(58) Field of Classification Search
CPC .... H04L 1/0077; H04L 1/0014; H03M 13/25; H04W 48/10; H04W 4/70
USPC ........................................................ 370/329
See application file for complete search history.

(56) References Cited

U.S. PATENT DOCUMENTS

| | | | |
|---|---|---|---|
| 2010/0201398 A1* | 8/2010 | Zhao | H04L 1/0041 326/52 |
| 2012/0106410 A1 | 5/2012 | Jia et al. | |
| 2012/0170619 A1* | 7/2012 | Chang | H04B 7/086 375/211 |
| 2013/0230125 A1* | 9/2013 | Hu | H04L 1/0045 375/329 |
| 2015/0139120 A1* | 5/2015 | ElArabawy | H04L 27/3488 370/329 |
| 2015/0215068 A1 | 7/2015 | Wu | |
| 2015/0326360 A1 | 11/2015 | Malladi et al. | |
| 2018/0123841 A1* | 5/2018 | Wilhelmsson | H04L 1/0053 |

OTHER PUBLICATIONS

Kou Tanigawa and Hiroyuki Yomo; "Implementation and evaluation on wireless relaying based on superposition coding," Sections 1-2; IEICE Communications Society; Mar. 19, 2013; p. 582.

* cited by examiner

LAYERED MODULATION WITH MULTIPLE CODING RATES FOR MACHINE TYPE COMMUNICATION (MTC) TRANSMISSIONS

CLAIM OF PRIORITY

The present application claims priority to Provisional Application No. 62/393,237, entitled "LAYERED MODULATION FOR NARROWBAND BROADCAST TRANSMISSIONS TO MTC DEVICES", filed Sep. 12, 2016, to Provisional Application No. 62/398,654, entitled "LAYERED MODULATION WITH MULTIPLE SOURCES FOR NARROWBAND BROADCAST TRANSMISSIONS TO MTC DEVICES", filed Sep. 23, 2016 and to Provisional Application No. 62/398,664, entitled "LAYERED MODULATION WITH MULTIPLE ENCODERS FOR NARROWBAND BROADCAST TRANSMISSIONS TO MTC DEVICES", filed Sep. 23, 2016, all assigned to the assignee hereof and hereby expressly incorporated by reference in their entirety.

RELATED PATENT APPLICATIONS

The present application is related to PCT Patent Application No. PCT/US2017/051003, entitled "LAYERED MODULATION FOR MACHINE TYPE COMMUNICATION (MTC) TRANSMISSIONS", and PCT Patent Application No. PCT/US2017/051005, entitled "LAYERED MODULATION FOR MACHINE TYPE COMMUNICATION (MTC) TRANSMISSIONS FROM MULTIPLE TRANSCEIVER STATIONS", both filed concurrently with this application, assigned to the assignee hereof, and hereby expressly incorporated by reference herein.

FIELD

This invention generally relates to wireless communications and more particularly to devices and methods for transmitting information to machine type communication (MTC) devices using layered modulation from multiple transceiver stations.

BACKGROUND

Machine type communication (MTC) is a form of data communication which involves one or more entities that do not necessarily need human interaction. Depending on the particular implementation, an MTC device may communicate with one or more servers or with other devices. The network operator provides network connectivity to MTC server(s) regardless of whether the MTC server is controlled by the network operator. An MTC device is typically a user equipment (UE) device that is equipped for Machine Type Communication and communicates through a public land mobile network (PLMN) with MTC Server(s) and/or other MTC Device(s). In some situations, an MTC device might also communicate locally through a hardwired or wireless connection with other entities.

MTC devices are increasingly being used in a variety of applications. Examples of some of the general areas of use include security, tracking, health, payment, remote diagnostics, metering and consumer electronics. Some of the many specific applications include surveillance system control, control of physical access (e.g. to buildings), fleet management, order management, asset tracking, navigation, traffic information, road tolling, point of sales, vending machines, gaming machines, vital signs monitoring, web access telemedicine points, remote maintenance and control of sensors, lighting, pumps, valves, and elevators, vehicle diagnostics, metering of power, gas, water and heating, grid control, and management and control of digital photo frames, cameras and eBooks.

SUMMARY

A base station broadcasts information to machine type communication (MTC) devices in the coverage area of the transceiver station using layered modulation where MTC devices receiving the broadcast above a signal quality threshold can recover the MTC information by applying a high modulation order. MTC devices receiving the broadcast below the quality threshold, recover a portion of the MTC information by applying a lower modulation order and recover the remaining portion of the MTC information transmitted from a relay station. The base station includes an encoder that encodes a first set of bits of MTC information with a first coding rate and encodes a second set of MTC information bits with a second coding rate. The first set and second of bits are modulated using layered modulation and broadcast within the service area of the base station in a first transmission such that the first set of bits can be recovered using the low modulation order and the second set of bits can be recovered using the high modulation order. A relay station receives, demodulates and decodes the first transmission to recover at least the second set of bits. The relay station transmits a second set transmission including at least the second set of bits to at least one MTC device that did not recover the second set of bits from the first transmission.

DETAILED DESCRIPTION

As mentioned above, MTC devices are increasingly being used for numerous applications where the MTC devices exchange information with other devices and servers. The network facilitating communication with the MTC devices must handle the increased traffic due to the numerous MTC devices while accommodating the particular requirements and limitations of the MTC devices. One important consideration includes minimizing the power consumption of the MTC device. As a result, it is advantageous to minimize the time that the MTC device transmits and receives data. In addition, in some situations, it is critical that the information be received uninterrupted at the MTC device. For example, firmware updates should not be interrupted.

Communication systems employ a variety of transmission techniques to maximize efficiency of network resources. One example includes broadcasting information to multiple devices simultaneously rather than establishing a dedicated channel to each of the devices. The same information may be broadcasted from several base stations to devices in multiple service areas. In other situations, however, the information is broadcasted in a single service area or cell. In systems operating in accordance with at least some revisions of The Third Generation Partnership Project (3GPP) Long Term Evolution (LTE) specification, this broadcast is typically referred to as a single cell-point to multipoint (SC-PTM) transmission and is performed using Multimedia Broadcast Multicast Services (MBMS). For SC-PTM transmission of MBMS in accordance with 3GPP specifications, MBMS is transmitted in the coverage of a single cell where one Single Cell-Multicast Control Channel (SC-MCCH) and one or more single cell-multicast traffic channel(s) SC-MTCH(s) are mapped on a Downlink Shared Channel (DL-SCH). For conventional SC-PTM, the base station (eNB) and the core network (CN) schedule the SC-PTM transmissions. In particular, the SC-MCCH and SC-MTCH transmissions are each indicated by a logical channel specific Radio Network Temporary Identifier (RNTI) on the Physical Downlink Shared Channel (PDSCH). There is a one-to-one mapping between Temporary Mobile Group Identity (TMGI) and G-RNTI used for the reception of the DL-SCH to which a SC-MTCH is mapped. As with all existing broadcast mechanisms, including SC-PTM, the broadcast is not guaranteed to reach all UE devices within a cell. With conventional techniques, the broadcast multicast or Single-cell Point-to-Multipoint (SC-PTM) transmissions are designed to meet a target number of UE devices to be able to decode the data packets successfully. In most cases the broadcast transmissions are designed to provide a Block Error Rate less than one percent (BLER<1%) for 95% of the UE devices in the cell.

If higher robustness is needed (e.g., for firmware downloads where none of the data can be dropped for the download to be successful), and if the worst-channel condition information is available (e.g., with Channel State Information (CSI) feedback) then one of the viable solutions is for the base station to transmit the data robust enough to overcome those channel conditions. This may lead to increased use of resources, however, if broadcast data needs to be transmitted at lower MCS (to allow cell edge UEs to receive the broadcast successfully). Alternatively, higher power broadcast transmissions may be used, but resulting in increased interference to neighboring eNBs.

Other approaches for higher broadcast robustness are based on the use of Hybrid Automatic Repeat Request (HARQ) feedback from the receivers which were unable to decode the data successfully. The base station can then apply link-adaptation for the retransmissions. However, several factors need to be considered. If HARQ retransmissions or any type of feedback is needed from the UE it will be necessary for the MTC device to transmit feedback information to the eNB. This is not desirable for MTC devices, since the main criteria for the MTC UE device includes reducing power consumption. However, unlike other non-MTC applications, latency is generally not an issue for MTC UEs. Therefore, solutions for higher robustness could be achieved at the expense of higher latency.

Assuming feedback is not provided to the base station (eNB), it will be necessary for the eNB to decide how the SC-PTM transmissions should be configured. In particular, depending on the intended coverage of the SC-PTM transmissions, the base station (eNB) needs to decide the Modulation and Coding Scheme (MCS) configuration used for the transmissions. With higher MCS, more traffic data can be sent in a shorter duration giving MTC UEs more time to sleep and conserve power, while lower MCS configuration allows better penetration into all coverage areas but at a much lower data rate requirement more power consumption from MTC device.

With conventional techniques, SC-PTM transmission is only transmitted at a particular modulation order, one that will cover up to 90 percent of devices in its cell. Although a lower modulation order may be used to increase the percentage of coverage, devices that can successfully receive the data packet at a higher modulation order will need to stay awake longer since the same data packet will need to be transmitted over multiple transmissions at the lower modulation order. In other words, majority of the devices will suffer (power-consumption-wise) for the benefit of the few devices that cannot receive the packet at the higher modulation order. Under the conventional techniques, a device that cannot receive SC-PTM has the option to obtain the same data packets over Unicast service. However, unicast service is not preferable for a MTC device due to higher power consumption. Furthermore, additional power will be consumed if the MTC device needs to transition to the connected mode to receive the unicast service and the MTC device was originally in the Idle mode (to conserve power). Note that SC-PTM can be received while the MTC device is in the Idle mode. This is also undesirable from a network resource perspective as the main objective of SC-PTM is to be able to broadcast information to many devices that are interested in the same contents without the need to for Unicast delivery. As discussed below, these considerations are addressed by applying layered modulation to broadcasted MTC information from a first transceiver station that allows an MTC device in lower signal quality area of the first transceiver to recover a portion of the MTC information using a lower modulation order and to recover the remaining portion of MTC information from a second transceiver station. The base station applies different coding rates to portions of the bits comprising the MTC information where each portion is modulated at a different modulation order.

Figure 1:
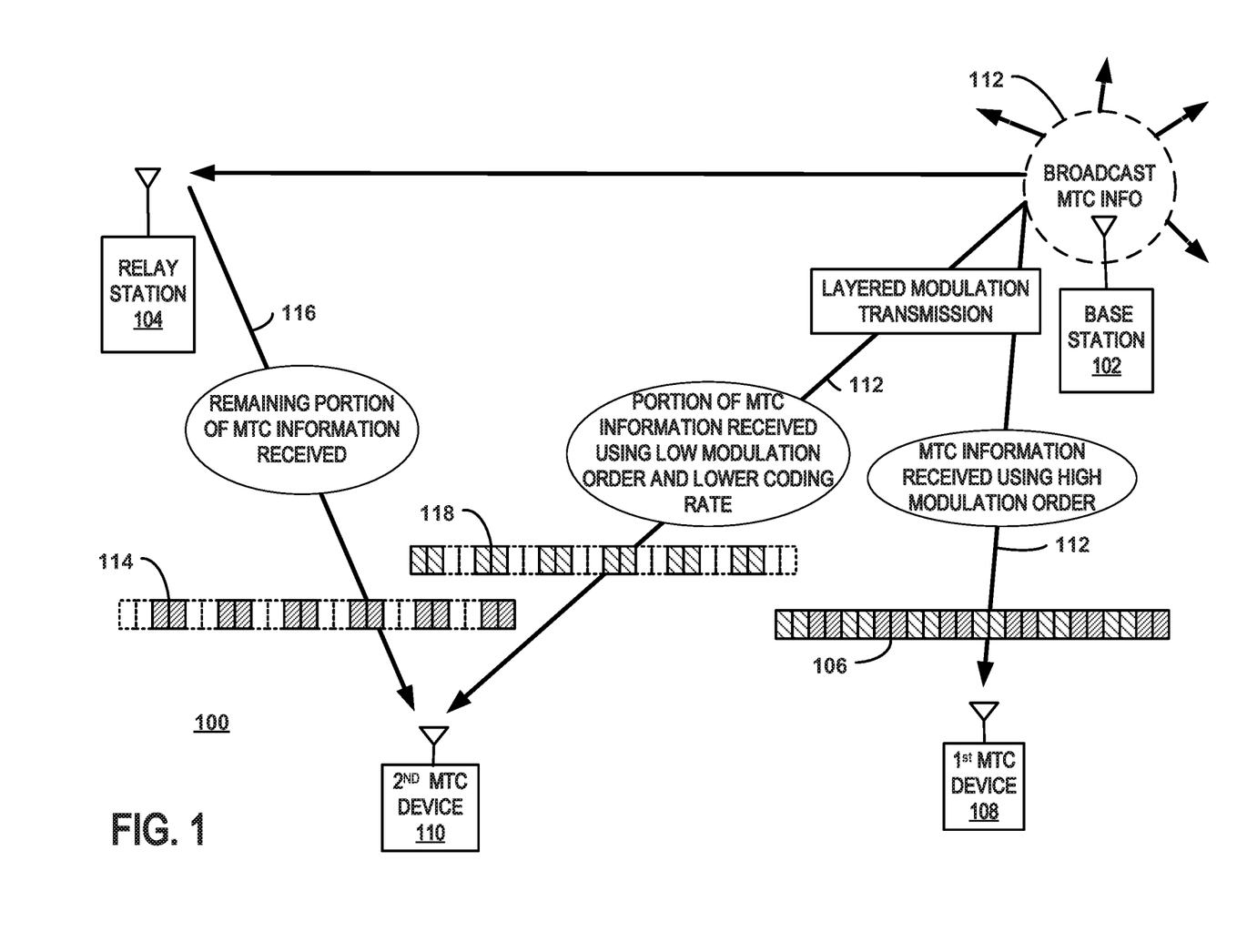
FIG. 1 is a block diagram of a communication system including a base station 102 and a relay station providing MTC information to MTC devices within the service areas of the transceiver stations.

FIG. 1 is a block diagram of a communication system 100 including a base station 102 and a relay station 104 providing MTC information 106 to MTC devices 108, 110 within the service areas of the transceiver stations 102, 104. The base station 102 can be any type of base station, access point, radio head, eNodeB, or other device capable of transmitting signals within a geographical service area and performing the functions described herein. The relay station 104 can be any standalone relay station or base station with relay functionality. In some situations, the relay station can be a UE device or MTC UE device.

The MTC devices 108, 110 are devices that employ machine type communication (MTC) and are otherwise user equipment (UE) devices operating on the communication system 100. For the examples herein, the communication system 100 operates in accordance with at least one revision of a 3GPP communication specification although the principles and techniques discussed may be applied to other types of systems in some circumstances. The base station broadcasts MTC information 106 within the cell using Multimedia Broadcast Multicast Services (MBMS) techniques for the example. Accordingly, the broadcast transmissions are SC-PTM transmissions. For the example of FIG. 1, the MTC information 106 is broadcast from the base station 102 using layered modulation in a first transmission 112 and at least some of the MTC information 114 is transmitted from the relay station 104 in a second transmission 116.

The MTC information 106 is directed to multiple MTC devices such as the MTC devices 108, 110. For the example of FIG. 1, two MTC devices 108, 110 are shown although many situations may include numerous MTC devices. For the example, a first MTC device 108 receives the signals transmitted from the base station 102 at a first signal quality level and a second MTC device 110 receives the signals transmitted from the base station 102 at second signal quality lower than the first signal quality. The difference in signal quality may be due to a variety of conditions such a noise, signal attenuation, obstacles in the signal path and receiver quality. For example, the first MTC device 108 may be closer to the first transceiver station 102 than the second MTC device 110 and may therefore receive signals at a higher strength.

For the example of FIG. 1, the base station 102 broadcasts all of the MTC information 106 using layered modulation such that all of the MTC information 106 can be recovered by a MTC device using a high modulation order to demodulate the transmission and such that some of the MTC information can be recovered by a MTC device using a low modulation order lower than the high modulation order. The high modulation order can be used to successfully demodulate the signal when the signal quality of the received transmission is above a signal quality threshold. As discussed below in further detail, the base station 102 applies different coding rates to portions of the MTC information. A first set of MTC information bits is coded at a first coding rate and a second portion of MTC information bits is coded at a second coding rate. A first portion of MTC information 118 includes a first set of bits that are encoded at a first coding rate. A second portion of MTC information 114 includes a second set of bits encoded at a second coding rate. For the example of FIG. 1, the first set of bits is encoded at a lower coding rate than the second set of bits and the resulting first set of coded bits is modulated at lower modulation order than the resulting set of coded bits.

Since the transmission 112 from the base station 102 includes all of the MTC information 106 in the example, the MTC information 106 can be recovered with successful demodulation of only the first transmission 112 and decoding of the both sets of coded bits using the different decoding rates to recover the first portion of MTC information and the second portion of MTC information. In order to recover all bits of the MTC information from the transmission 112, however, the receiving MTC device must apply a higher modulation order to demodulate the transmission. A lower modulation order can be applied to recover a portion of the MTC information 118 contained in the first transmission 112 and by applying the first decoding rate.

For the example of FIG. 1, the second MTC device 110 receives signals from the base station 102 below the signal quality threshold that allows demodulation of the transmission 112 using the higher modulation order. The second MTC device 110, however, applies the low modulation order to demodulate the transmission 112 and recovers a portion of the MTC information 118 which is decoded using the lower coding rate. The remaining portion of the MTC information 114 is received from the relay station 104. The remaining portion of MTC information 114 may be transmitted at the low modulation order or the high modulation order depending on the implementation and/or circumstances. The remaining portion 114 may be transmitted as part of transmission that includes all of the MTC information or may be transmitted without other MTC information. In addition, the relay station may use a different communication technology to convey the remaining portion of MTC information. For example, WiFi, Bluetooth, and other IEEE 802.11 wireless techniques can be used to convey the second portion of MTC information 114.

Generally, using the higher modulation order will require fewer transmissions leading to less processing time than demodulating a higher number of transmissions at a lower modulation order to receive the same information. As a result, using a higher modulation order typically reduces the power consumption of the MTC device because the device spends less time receiving the transmissions and more time in sleep mode or in some other less active state. Although for the example all of the information is transmitted in a transmission from the base station, other techniques can be used where the information is received over some number of transmissions where the number of transmissions required to retrieve all of the information is less using higher modulation orders than the number required to receive the information using lower modulation orders.

For the example, the relay station 104 recovers the second portion of MTC information 114 before forwarding it to the second MTC device 110. The relay station 104 applies the higher modulation order to recover all of the coded bits and then at least applies the higher coding rate to recover the second set of coded bits. The relay station transmits at least the second set of coded bits to the MTC device 110 in a second transmission which may be using the MBSFN techniques or point-to-point techniques and may use other communication technologies.

Therefore, the first MTC device 108 demodulates the transmission 112 from the base station 102 using the high modulation order to recover the MTC information 106 with minimum power consumption by receiving the MTC information 106 within a minimized reception time period. The second MTC device 110 cannot use the high modulation order for demodulating the transmission 112 and uses the low modulation order to demodulate the layered modulation transmission 112 to receive a portion of the MTC information 118. The first transmission is demodulated using the lower modulation order and the first set of coded MTC information bits is decoded using the lower coding rate. The MTC device 110 recovers the remaining portion of the MTC information 114 from the relay station 104 in a second transmission. The second MTC device 110, therefore, recovers all of the MTC information from information in multiple transmissions 112, 116 from multiple transceiver stations 102, 104.

Figure 2A:
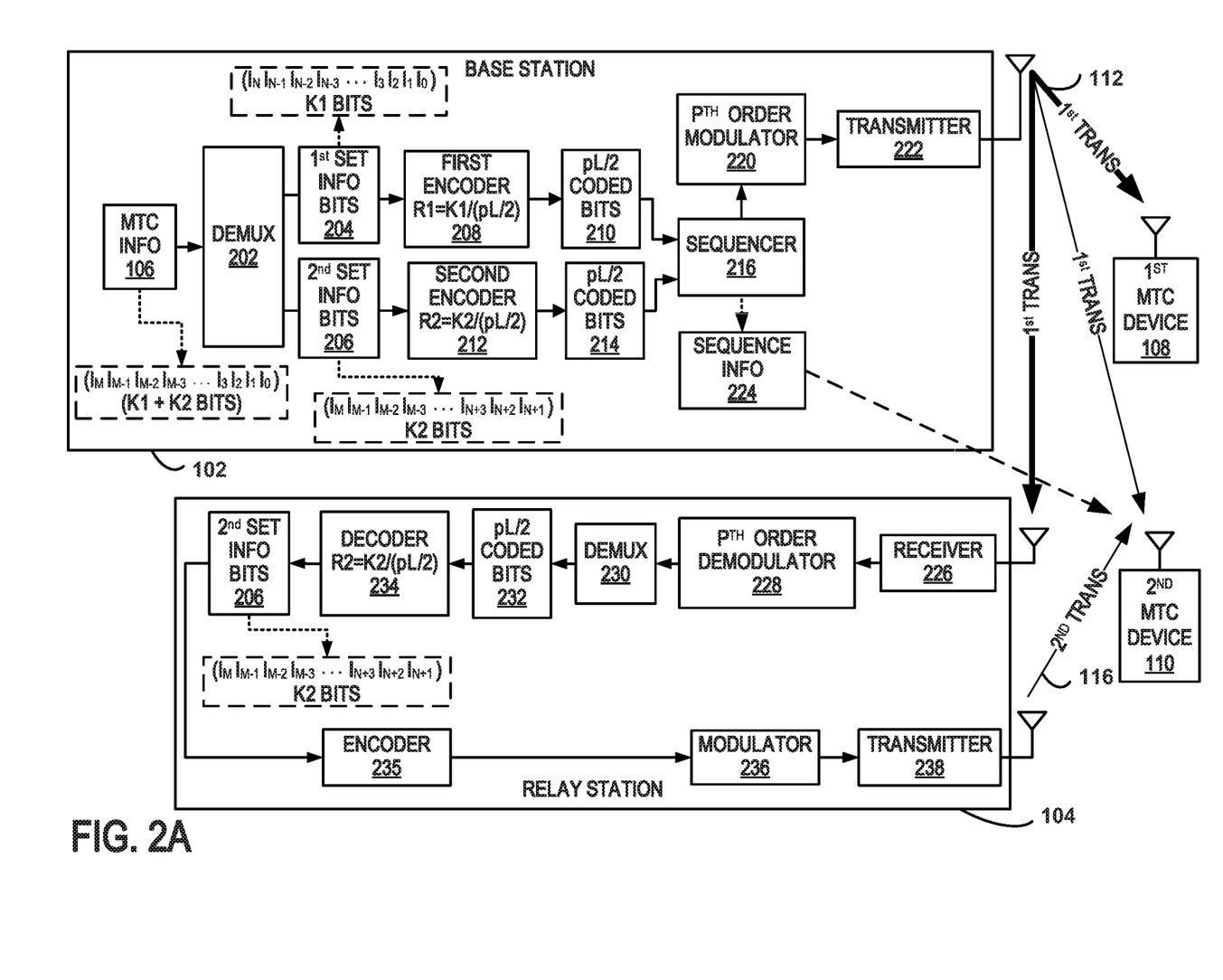
FIG. 2A is a block diagram of the communication system for an example where the base station separates the MTC information into two sets of bits and applies a different coding rate to each set.

FIG. 2A is a block diagram of the communication system 100 for an example where the base station 102 separates the MTC information into two sets of bits and applies a different coding rate to each set. For the example of FIG. 2A, the base station 102 is an eNB, eNodeB, access point, or any other device performing similar tasks in a system otherwise operating in accordance with a revision of a 3GPP communication specification. The relay station 104 for the example communicates with the base station 102 in accordance with the communication specification. The base station 102 and the relay station 104 provide wireless service within geographical service areas where the two areas at least partially overlap with each other. The second MTC device 110 can receive signals from the base station 102 and the relay station 104. For the example of FIG. 2A, all of the MTC information 106 is included in the first transmission 112 from the base station 102 and at least the second portion (second set of bits) of the MTC information 106 is included in the second transmission 116 from the relay station 104. The various functions and operations of the blocks described with reference to the base station 102 and relay station 104 may be implemented in any number of devices, circuits, electronics, code, or elements. Two or more of the functional blocks may be integrated in a single device, and the functions described as performed in any single block may be implemented over several devices. For example, the functions of the two encoders 208, 212 in the base station may be performed by a single device able to apply different coding rates to different sets of bits. Also, the functions of the encoders 208, 214 and sequencer 216 may be performed by a single signal processing device in some circumstances.

The base station 102 includes a demultiplexer (DEMUX) 202 that separates the bits of the MTC information into a first set of MTC information bits 204 and a second set of MTC information bits 206. The number of MTC information bits in the first set is K1 and the number of MTC information bits in the second set is K2 where the total number of MTC information bits is K1+K2. K2 is larger than K1 and, in the example, K1 and K2 are selected such that a desired number of coded bits is achieved after the bits are coded. The first set of MTC information bits is coded by a first encoder 208 having a first coding rate to generate a first set of coded bits 210. The second set of MTC information bits 206 is coded by a second encoder 212 having a second coding rate to generate a second set of coded bits 214. A sequencer 216 combines the bits from the first set of coded bits 210 and from the second set of coded bits 214 in a sequence of bits that is modulated by the modulator 220. The sequence of bits includes an equal number of first coded bits 210 and second coded bits 214 in the example. The modulator 220 is a $p^{th}$ order modulator that applies layered modulation to the sequence of coded bits. A transmitter 224 transmits the layered modulated signal within the service area of the base station 102 as the first transmission. For the example, the coding rates, K1, and K2 are selected such that the number of coded bits 210 in the first set is equal to the number of coded bits 214 in the second set. If L is the total number of modulated symbols generated in the first transmission 112, the number of coded bits in the first set of coded bits and the number of coded bits in the second set of coded bits is equal to pL/2 where p is the highest modulation order of the modulator 220. The coding rate of the first encoder is R1 and the coding date of the second encoder is R2 where R1=K1/(pL/2) and R2=K2/(pL/2).

For an example using numbers, assume that the total number of MTC information bits is equal to 96 and the modulator is $4^{th}$ order modulator. The 96 bits can be divided into two sets such that K1=32, k2=64. The encoders can be set to have rates of R1=1/4 and R2=1/2. For this example, therefore, the first encoder 208 generates 128 coded bits from 32 MTC information bits and the second encoder 212 codes 64 information bits 206 to generate 128 coded bits. The modulator applies 4th order modulation to the sequence of bits that includes 256 coded bits to generate 64 modulated symbols, each of which is represented by one of 16 possible symbols.

For the example of FIG. 2A, the layered modulation includes two modulation orders including a high modulation order and a low modulation order. The terms "high" and "low" are used to designate the relative level of modulation order between the two orders. Therefore, the high modulation order has a higher order than the low modulation order although both can be higher or lower relative to other modulation orders. Examples of suitable modulation orders include quadrature amplitude modulation with different constellation sizes such as 4-QAM and 16-QAM modulation techniques. As is known, 4-QAM is a quadrature amplitude modulation scheme where the data is represented by a single symbol in each of four quadrants of a phase-amplitude representation. For 16-QAM, data is represented by four different symbols in each quadrant. As a result, 16-QAM allows for transmission of more data over time than 4-QAM but requires the receiver to be able to distinguish between smaller differences between phase and amplitude to identify symbols than 4-QAM. Each modulation order requires a minimum signal quality of the received signal at the receiver in order to adequately demodulate the signals and recover the data. Therefore, a received signal must meet a minimum signal quality threshold in order for the receiver to receive a 16-QAM signal. If the signal is transmitted at a higher modulation order while keeping the mean energy the same as the signal transmitted at a lower modulation order, the constellation points of the higher modulation order must be closer together. As a result, assuming the noise and interference level stays the same, it will be more difficult for the receiver to correctly demodulate the signal at higher modulation order.

The lines representing the transmissions in FIG. 2A are shown with heavier lines of the first transmission 112 to the first MTC device 108 and to the relay station 104 heavier than the line to the second MTC device 110 to indicate that the signals are being received at a higher quality at the first MTC device 108 and the relay station 104 than at the second MTC device 110. For the example, signal quality of the received transmission at the first MTC device 108 is sufficiently high to allow the first MTC device 108 to demodulate the first transmission 112 at the high modulation order (e.g., 16-QAM). The signal quality of the received transmissions at the second MTC device 106 is not sufficient to allow the second MTC device 110 to demodulate the first transmission 112 at the high modulation order (e.g., 16-QAM). The signal quality, however, is adequate for the second MTC device 110 to demodulate the first transmission at the low modulation order (e.g., 4-QAM).

Typically, a base station provides Modulation and Coding Scheme (MCS) configuration information to UE devices and MTC devices. For the examples herein, the base station provides the MCS information for both coding rates. As a result, the base station transmits MCS1 and MCS2.

In some situations, the sequences of coded bits are predetermined and static. In other circumstances, however, the sequence of the bits in the transmission 112 is dynamically changing or otherwise not known by the MTC devices 108, 110. As a result, the base station 102 provides the sequence to the MTC devices 108, 110 and the relay station 104. An example of suitable technique includes transmitting the sequence information 224 in a control signal such as a part of the control information provided in the SC-MCCH for SC-PTM and in the MCCH for MBSFN. For the example, the control channels are transmitted at a lower modulation order such that all UE devices are able to obtain the information throughout the cell coverage area. An example of another suitable technique for transmitting the sequence information includes broadcasting the information over a system broadcast message in a semi-static manner. Where the sequence is known to the MTC devices, the sequence information is not transmitted. For example, if the sequence includes using the most significant bits from one encoder and the least significant bits from a second encoder, the sequence information may not need to be transmitted to the MTC devices.

As described below with reference to FIG. 2B for a specific example, the sequencer 216 applies the coded bits from the first encoder the most significant bits of the symbol and applies the least significant bits to the least significant bits of the symbol.

The receiver 226 in the relay station 104 receives the first transmission 112 from the base station 102 at a quality level above the signal quality threshold required to demodulate the signal using the high modulation order. The demodulator 228 demodulates the received signal to recover the sequence to coded bits. A demultiplexer (DEMUX) applies the sequence information 224 to separate the first set of coded bits 204 from the second set of coded bits 206. The decoder 234 applies the second coding rate to the coded bits to recover the second set of information bits 206. In some situation, the relay station 104 may also decode the first set of coded bits.

The second set of MTC information bits are encoded by a encoder 235, modulated by a modulator 236, and transmitted by a transmitter 236 to the second MTC device 110. Depending on the particular technique and communication technology used, the relay station may include other components for processing the MTC information bits before modulation and/or transmission. In some situations where the relay station is using the same communication channels as the base station for transmission to the MTC devices, the first transmission 112 and the second transmission 116 may include nulls to avoid interference. Interference can also be avoided in these situations by having only one of the stations (base station or relay station) transmitting at any given time. If the MTC information bits are transmitted using another communication technology such as Bluetooth, for example, the relay station may include another transmitter for transmitting 3GPP signals.

Figure 2B:
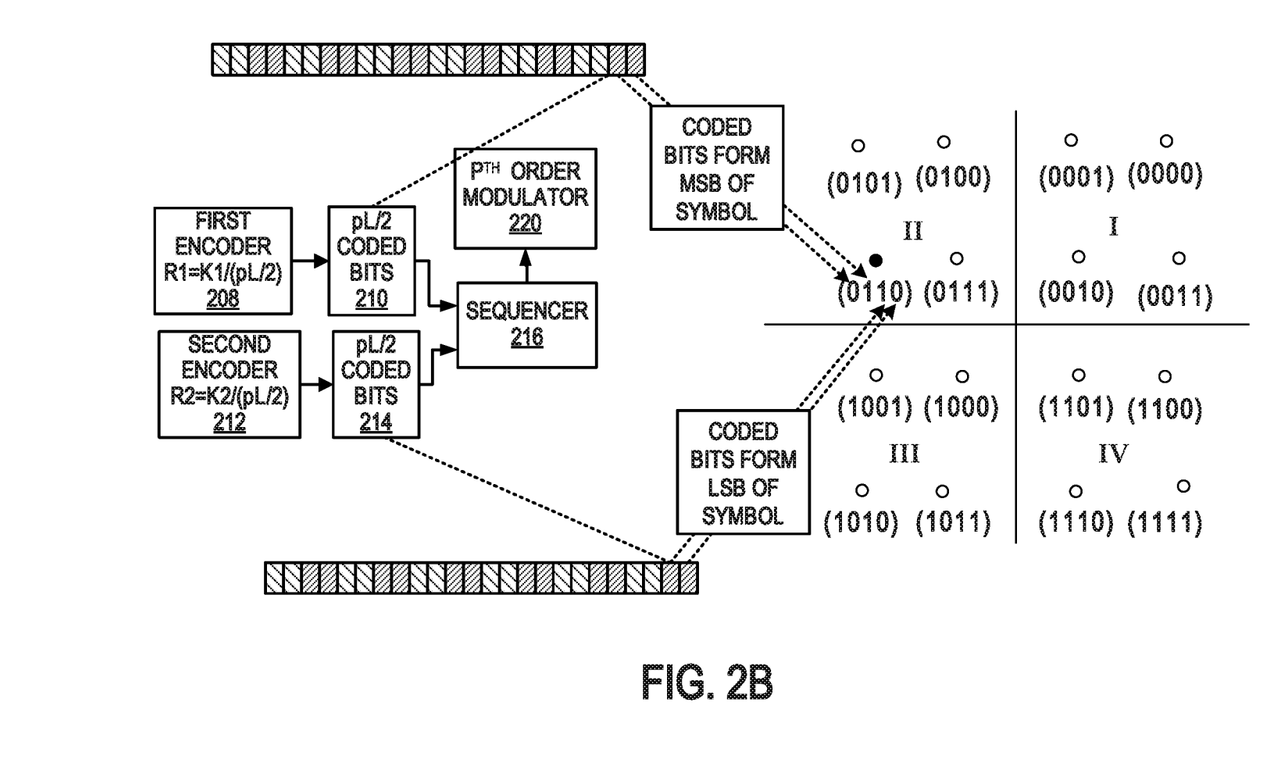
FIG. 2B is an illustration of the sequencing and modulation of coded bits for an example where the high modulation is 16 and the lower modulation order is 4.

FIG. 2B is an illustration of the sequencing and modulation of coded bits for an example where the high modulation is 16 and the lower modulation order is 4. The sequencer and modulator form the symbols from the two sets of coded bits by applying the coded bits from the first encoder to the most significant bits (MSB) of the symbol and applying the coded bits from the second encoder to the least significant bits of the symbol. For the example of FIG. 2B, therefore, the two coded bits from the first encoder are "01" and the coded bits from the second encoder are "10" to form the symbol "0110". A receiver applying the lower modulation order (in this example equal to 4) would only be able to determine the quadrant where the symbol appears (II) and recover only the first two most significant bits ("01"). A receiver applying the higher order modulation order (in this example equal to 16) would recover the least significant bits as well as the most significant bits to recover the four coded bits "0110".

Figure 3:
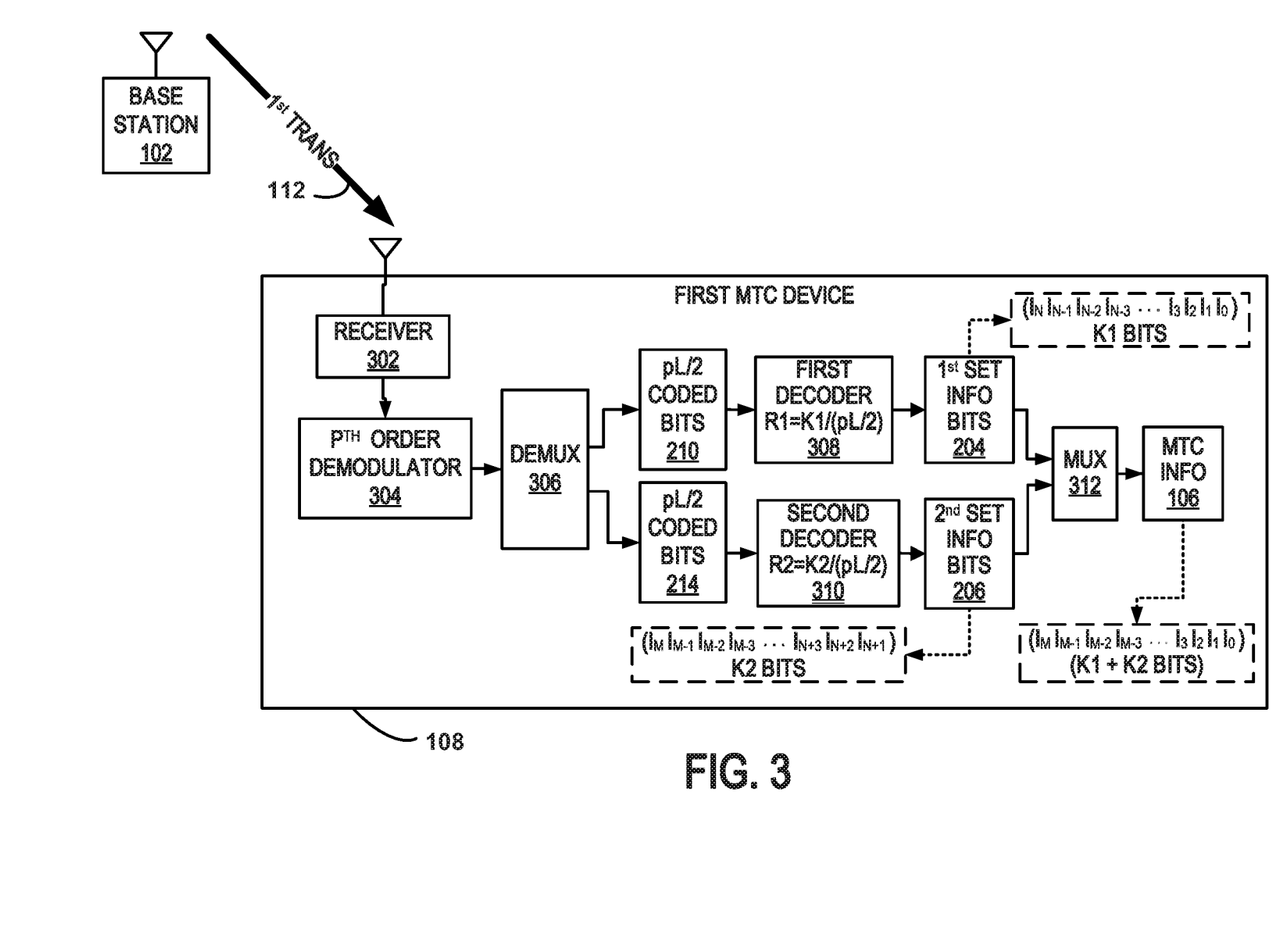
FIG. 3 is a block diagram of the system where first MTC device is receiving the first transmission from the base station.

FIG. 3 is a block diagram of the system 100 where first MTC device is receiving the first transmission 112 from the base station 102. The various functions and operations of the blocks described with reference to the first MTC device 108 and the second MTC device 110 may be implemented in any number of devices, circuits, electronics, code, or elements. Two or more of the functional blocks may be integrated in a single device, and the functions described as performed in any single block may be implemented over several devices. For example, the functions of the two decoders 308, 310 in the first MTC device 108 may be performed by a single device able to apply different coding rates to decode different sets of bits. Also, the functions of the receiver 302 and the demodulator 304 may be performed by a single receiver apparatus in some circumstances.

The receiver 302 receives the first transmission 112 from the base station 102 at a signal quality above a signal quality threshold that allows the demodulator 304 to demodulate the received signal using the high modulation order. The demodulated signal is separated into the first set of coded bits 210 and the second set of coded bits 210 by a demultiplexer (DEMUX) 306. The demultiplexer 306 applies the sequence information 224 to separate the coded bits. The first set of coded bits 210 is decoded in a first decoder 406 recover the first set of MTC information bits 204. The first decoder 308 applies the first coding rate to recover the first set of bits 204. The second set of coded bits 214 is decoded in a second decoder 310 recover the second set of MTC information bits 206. The second decoder 406 applies the second coding rate to recover the second set of bits 206. A multiplexer 312 combines the two sets of MTC information bits to form the original MTC information.

Figure 4:
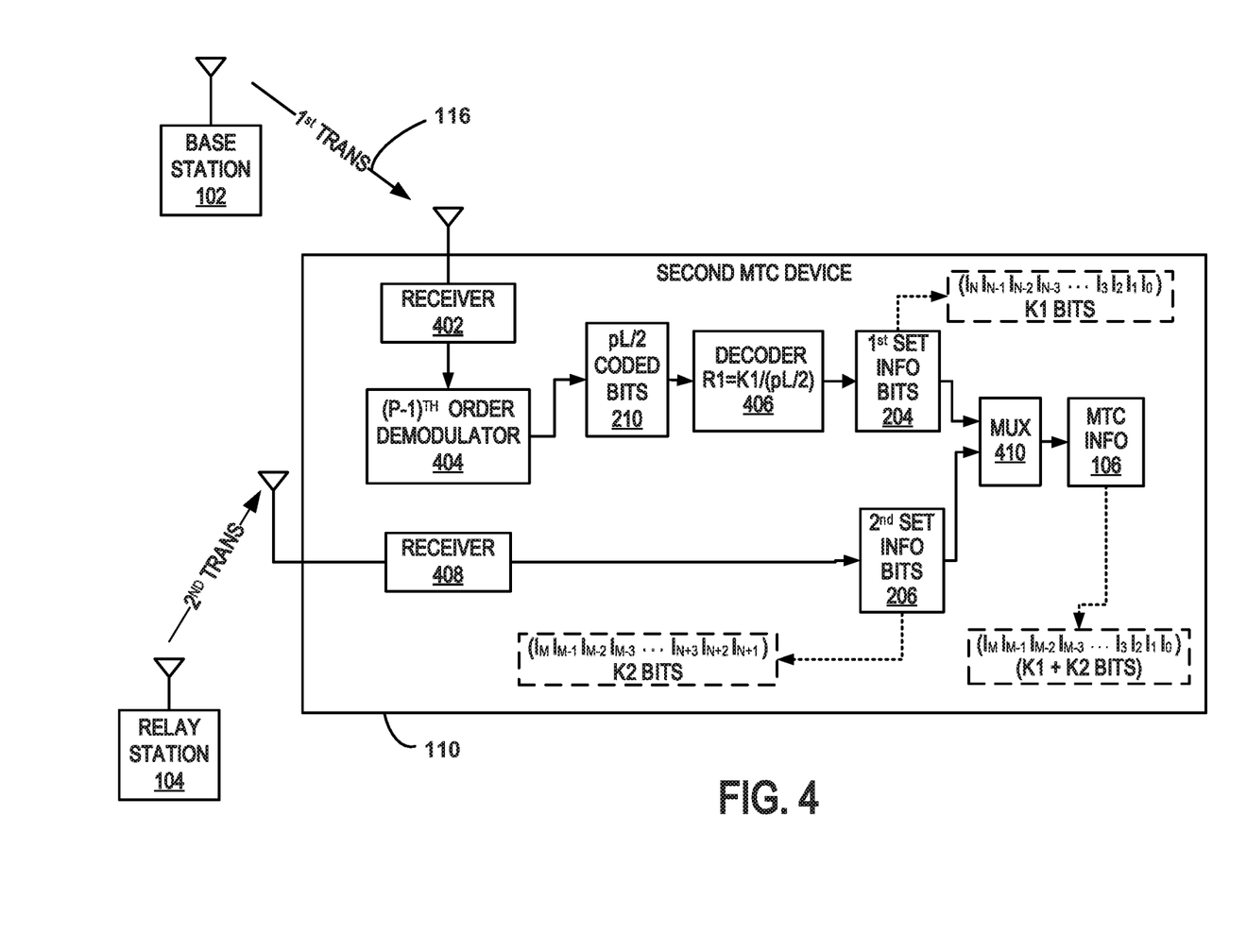
FIG. 4 is a block diagram of the system where the second MTC device is receiving the first transmission from the base station and the second transmission from the relay station.

FIG. 4 is a block diagram of the system 100 where the second MTC device 110 is receiving the first transmission 112 from the base station 102 and the second transmission 116 from the relay station 104. The various functions and operations of the blocks described with reference to the second MTC device 110 may be implemented in any number of devices, circuits, electronics, code, or elements. Two or more of the functional blocks may be integrated in a single device, and the functions described as performed in any single block may be implemented over several devices. For example, the functions of the receiver 402 and the demodulator 404 may be performed by a single receiver apparatus in some circumstances. In some situations, the first MTC device 108 and the second MTC device 110 may include the same components and functionality. In the interest of brevity and clarity, only the functions related to the particular example are discussed with reference to FIG. 3 and FIG. 4. For example, in some situations, the second MTC device 110 includes a demultiplexer 306 and a second decoder 310 for recovering the second set of MTC information bits when conditions allow.

The receiver 402 receives the first transmission 112 from the base station 102 at a signal quality below the signal quality threshold that allows the demodulator 404 to demodulate the received signal using the high modulation order. As a result, the demodulator 404 applies the lower modulation order to recover the first set of coded bits 210. The demodulator 404 applies the sequence information 224 to extract the first set of coded bits 210. The first set of coded bits 210 is decoded in a decoder 406 to recover the first set of MTC information bits 204. The decoder 406 applies the first coding rate to recover the first set of bits 204.

Another receiver 408 receives the second transmission 116 from the relay station 104. In some circumstances, the functions of the two receivers 402, 408 are performed by a single receiver. If the base station and the relay station are transmitting their respective transmissions using channels of an LTE system, for example, a single receiver may be receiving both transmissions. However, if the second transmission is transmitted using a different communication technology, it is more likely that a separate receiver is used for receiving the second transmission. For the example of FIG. 4, the receiver 408 demodulates and applies any required processing to the second transmission 116 to recover the second set of MTC information bits 206. A multiplexer 340 combines the first set of MTC information bits 204 received from the base station 102 with the second set of MTC information bits 206 received from the relay station 104 to form the original MTC information 106.

Figure 5:
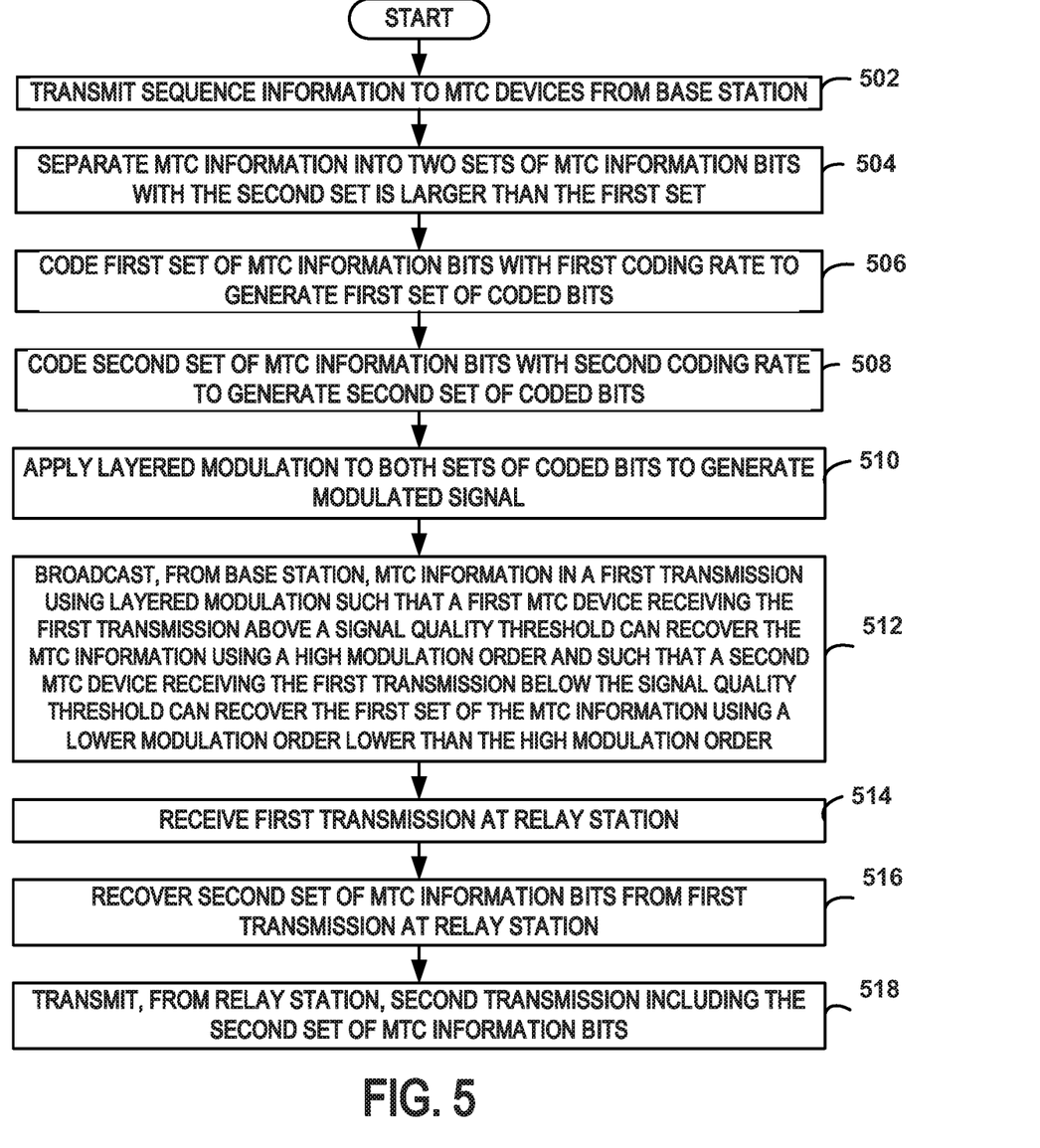
FIG. 5 is a flow chart of an example of a method of broadcasting MTC information from a base station and a relay station.

FIG. 5 is a flow chart of an example of a method of broadcasting MTC information 103 from a base station and a relay station. The steps of FIG. 5 can be performed in a different order than shown and some steps may be combined into a single step. Additional steps may be performed and some steps may be omitted.

At step 502, the sequence information 224 is transmitted to the MTC devices in the cell. The sequence information 224 indicates the sequence order of bits in one or more transmissions. The base station broadcasts the sequence information 224 as control information over SC-MCCH, MCCH, or System information. In some circumstances, the relay station 104 transmits the sequence information 224.

At step 504, the MTC information bits are separated into a first set of MTC information bits 210 and a second set of MTC information bits 214. For the examples herein, the demultiplexer 202 in the base station 102 gerates the two sets from the MTC information 106.

At step 506, the first set of MTC information bits is coded at a first code rate. For the example, the first encoder 208 in the base station 102 encodes the first set of MTC information bits 204 to generate the first set of coded bits 210.

At step 508, the second set of MTC information bits is coded at a second code rate. For the example, the second encoder 208 in the base station 102 encodes the second set of MTC information bits 206 to generate the second set of coded bits 214.

At step 510, layered modulation is used to modulate both sets of coded bits to generate a layered modulated signal. A sequencer selects coded bits from both sets to generate a sequence of bits that are modulated at the high modulation order. For the examples herein, the number of bits (K2) in the second set of MTC information is greater than the number (K1) of bits in the first set. The second coding rate is greater than the first coding rate. Coding rates and the numbers of bits in each set are selected such that the resulting number of coded bits from each set is equal. The modulator 220 applies a $p^{th}$ order modulation to the combined coded bits such that L symbols are generated from the collection of coded bits. Accordingly, the first coding rate (R1) is equal to $K1/(pL/2)$ and the second coding rate (R2) is equal to $K2/(pL/2)$.

At step 512, the base station 102 broadcasts the MTC information in the first transmission 112. As described above the signal is modulated using layered modulation such that MTC devices receiving the transmission above a signal quality threshold can demodulate the transmission to recover all of the MTC information included in the transmission using a high modulation order. Other MTC devices can recover a portion of the MTC information (the first ste of MTC information bits) by applying a lower modulation order to demodulate the first transmission.

In one scenario, as discussed above, the transmission may include 16-QAM modulation and 4-QAM modulation such that the MTC information is recoverable by a MTC device by applying 16-QAM demodulation to the transmissions and the portion of MTC information is recoverable by another MTC device by applying 4-QAM to the transmission.

At step 514, the relay station 104 receives the first transmission 112. For the example, the relay station 104 receive the first transmission at a quality above the signal quality threshold and demodulates the transmission 112 using the high modulation order (p).

At step 516, the relay station 104 recovers the second set of MTC information bits 206 from the first transmission. For the example, the relay station 104 applies the second coding rate to decode the second set of coded bits 210 and recover the second set of MTC information bits 206.

At step 518, the relay transmits a second transmission that includes the second set of MTC information bits 206. Although the second transmission 116 can be transmitted in accordance with 3GPP LTE communication standards, the second transmission may be transmitted using other wireless communication techniques such as WiFi and Bluetooth.

Figure 6:
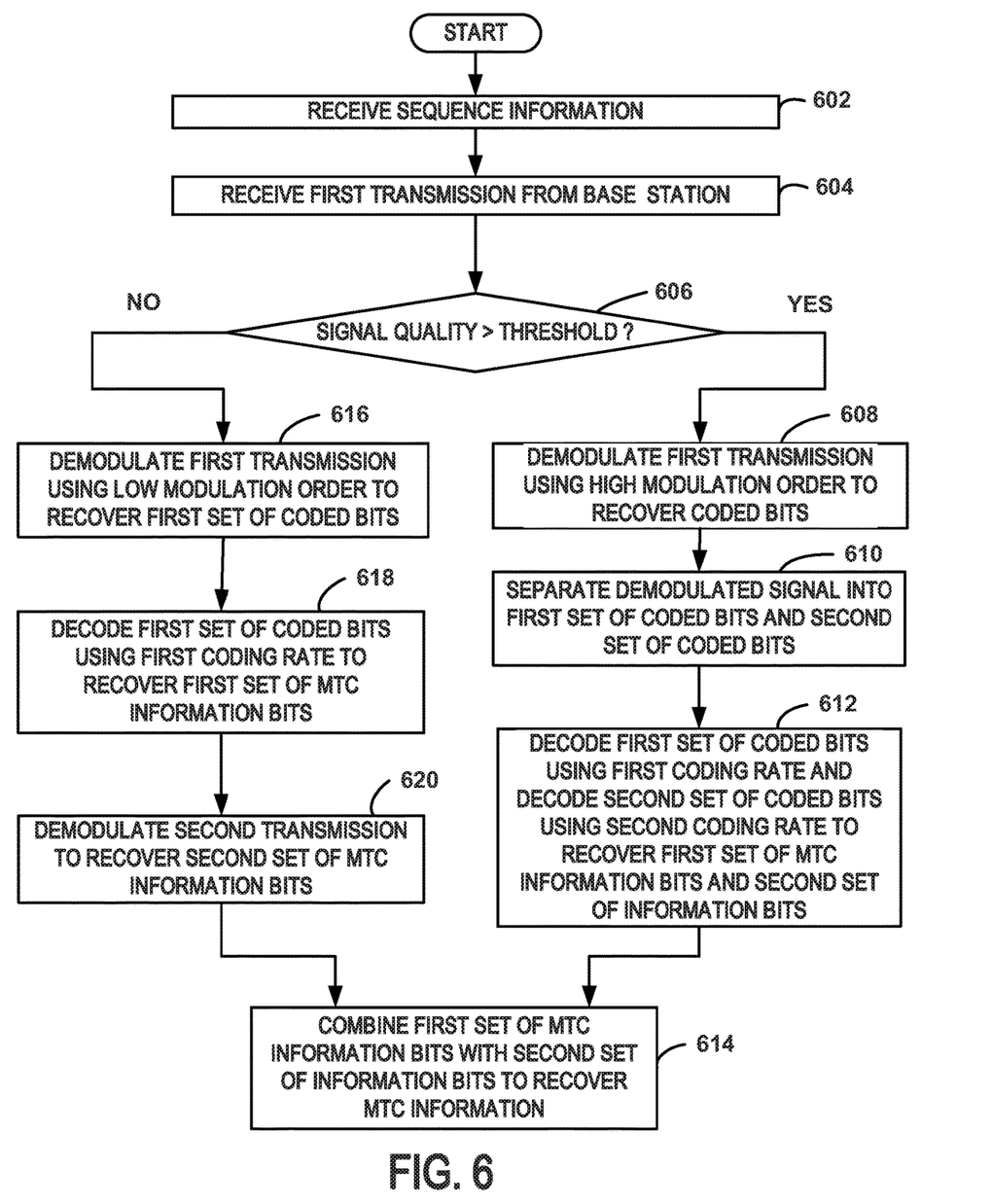
FIG. 6 is a flow chart of a method of receiving MTC information at a MTC device.

FIG. 6 is a flow chart of a method of receiving MTC information at a MTC device. The steps of FIG. 6 can be performed in a different order than shown and some steps may be combined into a single step. Additional steps may be performed and some steps may be omitted. For the example, the method is performed by a MTC UE device such as the MTC device 108 or the MTC device 110.

At step 602, sequence information is received from the base station or relay station, or both.

At step 604, the MTC device receives the first transmission from the base station 102.

At step 606, it is determined where the signal quality of the first transmission received from the base station is above a signal quality threshold. The threshold is the minimum signal quality that allows the MTC device to successfully demodulate the transmission using the high modulation order. The threshold may be, or may be based on any combination of a signal to noise ratio (SNR), signal-to-noise-plus-interference ratio (SNIR). Reference Signal Received Quality (RSRQ) Reference Signal Received Power (RSRP) or any other suitable parameter that allows the MTC device to determine if the higher modulation order can be used.

If the signal quality is above the threshold, the method continues at step 608 where the first transmission is demodulated using the high modulation order (e.g., 16-QAM). Otherwise, the method continues at step 616.

At step 608, the demodulator at the MTC device applies the pth order modulation to recover the coded bits.

At step 610, the coded bits are separated into the first set of coded bits 210 and the second set of coded bits 214. For the example, a demultiplexer separates the bits in accordance with the sequence information 224.

At step 612, both sets of coded bits are decoded. The first set of coded bits 210 is decoded using the first code rate to recover the first set of MTC information bits 204. The second set of coded bits 214 is decoded using the second code rate to recover the second set of MTC information bits 206.

At step 614, the first set of MTC information bits 204 and the second set of MTC information bits 206 are combined to recover the MTC information 106.

At step 616, the first transmission is demodulated using the low modulation order to recover a portion of MTC information. The first set of coded bits 210 is recovered from the first transmission 112.

At step 618, the first set of coded bits is decoded using the first coding rate to recover the first set of MTC information bits 204.

At step 620, the MTC device receives the second transmission from the relay station. The second transmission is demodulated and otherwise processed to recover the second set of MTC information bits 214. The two sets of MTC information bits are combined at step 614 to recover the MTC information 106.

Clearly, other embodiments and modifications of this invention will occur readily to those of ordinary skill in the art in view of these teachings. The above description is illustrative and not restrictive. This invention is to be limited only by the following claims, which include all such embodiments and modifications when viewed in conjunction with the above specification and accompanying drawings. The scope of the invention should, therefore, be determined not with reference to the above description, but instead should be determined with reference to the appended claims along with their full scope of equivalents.

The invention claimed is:

1. A base station comprising: a first encoder configured to encode a first set of machine type communication (MTC) information bits with a first coding rate; a second encoder configured to encode a second set of MTC information bits with a second coding rate; a modulator configured to modulate the first set of MTC information bits and the second set of MTC information bits to generate a layer modulated signal; and a transmitter configured to broadcast the layer modulated signal as a first transmission such that a first MTC device receiving the transmission above a signal quality threshold can recover the first set of MTC information bits and the second set of MTC information bits and such that a second MTC device receiving the transmission below the signal quality threshold can recover the first set of MTC information bits using a lower modulation order lower than a high modulation order, wherein R1=K1/(pL/2) and R2=K2/(pL/2), where R1 is the first coding rate, R2 is the second coding rate, K1 is a number of first set of MTC information bits, K2 is a number of second set of MTC information bits, p is an order of modulation of the high order modulation, and L is a number of symbols generated by the modulator.

2. The base station of claim 1, wherein R1 is less than R2, each symbol comprises most significant bits and least significant bits such that the most significant bits are coded bits from the first encoded and the least significant bits are coded bits from the second encoder.

3. A communication system comprising: a base station comprising: a first encoder configured to encode a first set of machine type communication (MTC) information bits with a first coding rate; a second encoder configured to encode a second set of MTC information bits with a second coding rate; a modulator configured to modulate the first set of MTC information bits and the second set of MTC information bits to generate a layer modulated signal; and a transmitter configured to broadcast the layer modulated signal as a first transmission such that a first MTC device receiving the transmission above a signal quality threshold can recover the first set of MTC information bits and the second set of MTC information bits and such that a second MTC device receiving the transmission below the signal quality threshold can recover the first set of MTC information bits using a lower modulation order lower than a high modulation order; and a relay station comprising: a receiver configured to receive the first transmission; a demodulator configured to apply the high modulation order to demodulate the first transmission to generate the second set of coded bits; a decoder configured to decode the second set of coded bits to generate the second set of MTC information bits; a transmitter configured to transmit the second set of MTC information bits to the second MTC device, wherein R1=K1/(pL/2) and R2=K2/(pL/2), where R1 is the first coding rate, R2 is the second coding rate, K1 is a number of first set of MTC information bits, K2 is a number of second set of MTC information bits, p is an order of modulation of the high order modulation, and L is a number of symbols generated by the modulator.

4. A machine type communication (MTC) device comprising: a first receiver configured to: receive, from a base station, a first signal comprising MTC information, the first signal modulated using layered modulation such that a first set of MTC information bits is modulated with a high modulation order and that a second set of MTC information bits is modulated with a lower modulation order lower than the higher modulation order; a demodulator configured to demodulate the first signal using the lower modulation order to recover a set of coded bits; a decoder configured to decode the set of coded bits to recover the first set of MTC information bits; a second receiver configured to receive, from a relay station, a second signal comprising the second set of MTC information bits, wherein a number of the second set of MTC information bits is an integer multiple of a number of the first set of MTC information bits and wherein R1=K1/(pL/2) and R2=K2/(pL/2), where: R1 is the first coding rate, R2 is the second coding rate, K1 is the number of first set of MTC information bits, K2 is the number of second set of MTC information bits, p is an order of modulation of the high order modulation, and L is a number of symbols in the first signal.

5. The MTC device of claim 4, wherein the first receiver is further configured to receive sequence information indicating a sequence order of coded bits the first signal.

6. The MTC device of claim 4, wherein the first receiver and the second receiver are part of a receiver that operates in accordance with at least one revision of The Third Generation Partnership Project (3GPP) Long Term Evolution (LTE) communication specification.

7. The MTC device of claim 4, wherein first receiver operates in accordance with at least one revision of The Third Generation Partnership Project (3GPP) Long Term Evolution (LTE) communication specification and the second receiver is configured to operate in accordance with at least one of a WiFi, Bluetooth, and IEEE 802.11 communication protocol.

* * * * *